United States Patent
Jacobs et al.

(10) Patent No.: US 9,386,640 B2
(45) Date of Patent: Jul. 5, 2016

(54) LED PACKAGE WITH CAPACITIVE COUPLINGS

(71) Applicant: KONINKLIJKE PHILIPS N.V., Eindhoven (NL)

(72) Inventors: Egbertus Reinier Jacobs, Overloon (NL); Marc Andre De Samber, Lommel (BE)

(73) Assignee: KONINKLIJKE PHILIPS N.V., Eindhoven (NL)

(*) Notice: Subject to any disclaimer, the term of this patent is extended or adjusted under 35 U.S.C. 154(b) by 0 days.

(21) Appl. No.: 14/434,775

(22) PCT Filed: Oct. 11, 2013

(86) PCT No.: PCT/IB2013/059312
§ 371 (c)(1),
(2) Date: Apr. 10, 2015

(87) PCT Pub. No.: WO2014/060921
PCT Pub. Date: Apr. 24, 2014

(65) Prior Publication Data
US 2015/0289326 A1 Oct. 8, 2015

Related U.S. Application Data

(60) Provisional application No. 61/713,733, filed on Oct. 15, 2012.

(51) Int. Cl.
*H05B 33/08* (2006.01)
*H01L 25/16* (2006.01)
*H01L 33/00* (2010.01)
*H01L 33/52* (2010.01)

(52) U.S. Cl.
CPC .......... *H05B 33/0809* (2013.01); *H01L 25/167* (2013.01); *H01L 33/005* (2013.01); *H01L 33/52* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,411,045 B1 * | 6/2002 | Nerone | H02M 7/538 315/185 R |
| 8,004,070 B1 | 8/2011 | Chen | |
| 8,835,945 B2 * | 9/2014 | Maxik | H01L 27/153 257/88 |

(Continued)

FOREIGN PATENT DOCUMENTS

| | | |
|---|---|---|
| KR | 2010095826 A | 9/2010 |
| TW | 346916 U | 12/1998 |

(Continued)

*Primary Examiner* — Crystal L Hammond (57) ABSTRACT

A light emitting diode, LED, package (2) arranged to emit light when connected to an AC power supply (30), comprising a first and a second LED package terminal (24, 26), at least one pair of diodes (20, 22) connected in anti-parallel between the LED package terminals (24, 26), wherein at least one of the diodes is a light emitting diode. The first LED package terminal (24) is detachably connectable to a first power supply terminal (34), and adapted to form a first capacitive coupling (14) together with the first power supply terminal (34), and the second LED package terminal (26) is detachably connectable to a second power supply terminal (36), and adapted to form a second capacitive coupling (16) together with the second power supply terminal (36). By providing electrical connections which are less sensitive to temperature dependent degradation, the life time of the LED package (2) may be increased.

19 Claims, 4 Drawing Sheets

(56) References Cited

U.S. PATENT DOCUMENTS

| | | | |
|---|---|---|---|
| 2005/0212406 A1* | 9/2005 | Daniels | F21K 9/00 313/503 |
| 2005/0265035 A1 | 12/2005 | Brass et al. | |
| 2007/0273299 A1* | 11/2007 | Miskin | H05B 33/0818 315/250 |
| 2008/0218095 A1* | 9/2008 | Erhardt | H01G 4/40 315/224 |
| 2008/0252229 A1* | 10/2008 | Wu | H05B 33/0803 315/227 R |
| 2009/0096386 A1 | 4/2009 | Yeh et al. | |
| 2009/0237004 A1* | 9/2009 | Ploquin | H05B 33/083 315/294 |
| 2009/0267085 A1* | 10/2009 | Lee | F21K 9/00 257/88 |
| 2010/0176735 A1* | 7/2010 | Yang | H05B 33/0809 315/185 S |
| 2010/0309652 A1* | 12/2010 | Shen | F21K 9/17 362/157 |
| 2011/0084624 A1* | 4/2011 | Dekker | H01L 27/3202 315/250 |
| 2011/0121723 A1* | 5/2011 | Chen | H01L 33/486 313/509 |
| 2011/0169415 A1* | 7/2011 | Chen | H05B 33/0809 315/164 |
| 2011/0187279 A1* | 8/2011 | Radermacher | H05B 33/0821 315/251 |
| 2011/0210684 A1* | 9/2011 | Lanchava | F21V 21/096 315/312 |
| 2011/0234092 A1* | 9/2011 | Marinus | H05B 33/0809 315/35 |
| 2011/0291573 A1* | 12/2011 | Kuan | H05B 33/0815 315/186 |
| 2012/0062147 A1* | 3/2012 | Fan | H05B 33/0815 315/297 |
| 2012/0153851 A1* | 6/2012 | Sauerlaender | H05B 33/0857 315/192 |
| 2012/0286680 A1* | 11/2012 | Roberts | H05B 33/0809 315/200 R |
| 2013/0020955 A1* | 1/2013 | Igaki | H05B 33/0803 315/201 |
| 2013/0043791 A1* | 2/2013 | Stack | F21S 4/20 315/122 |
| 2013/0223063 A1* | 8/2013 | Lee | F21V 29/006 362/235 |
| 2014/0070712 A1* | 3/2014 | Lee | H05B 33/0818 315/186 |
| 2014/0361710 A1* | 12/2014 | Radermacher | F21S 2/00 315/294 |

FOREIGN PATENT DOCUMENTS

| | | |
|---|---|---|
| WO | 0231406 A1 | 4/2002 |
| WO | 0235889 A1 | 5/2002 |
| WO | 2006129291 A2 | 12/2006 |

* cited by examiner

LED PACKAGE WITH CAPACITIVE COUPLINGS

CROSS-REFERENCE TO PRIOR APPLICATIONS

This application is the U.S. National Phase application under 35 U.S.C. §371 of International Application No. PCT/IB13/059312, filed on Oct. 11, 2013, which claims the benefit of U.S. Provisional Patent Application No. 61/713,733, filed on Oct. 15, 2012. These applications are hereby incorporated by reference herein.

TECHNICAL FIELD OF THE INVENTION

The present invention relates to a LED package comprising diodes connected in anti-parallel. The invention also relates to a lighting circuitry including such a LED package, and to a method of manufacturing such a LED package.

BACKGROUND OF THE INVENTION

A light-emitting diode (LED) is an energy efficient solid state light (SSL) source used for many different types of applications.

A feature in common for all applications is that the LED needs to be driven by a power supply in order to emit light. Hence, the LED is often connected to the power supply via a circuitry, for example a printed circuit board (PCB), forming a LED arrangement. The LED may be connected to the circuitry by e.g. a wire, which may hinder at least a part of the light emitted.

Some currently employed LED arrangements use soldering techniques to connect the LED to the circuitry. However solder connections may degrade over time due to high temperatures. Furthermore, the process of making solder connections is associated with elevated temperature conditions, which may harm or damage the LED or other components connected to the LED.

SUMMARY OF THE INVENTION

In view of the above-mentioned and other drawbacks of the prior art, a general object of the present invention is to provide an improved light-emitting device, in particular providing for a way to increase the life time of the light-emitting device.

According to a first aspect of the invention, there is provided a light emitting diode, LED, package arranged to emit light when connected to an AC power supply, comprising a first LED package terminal and a second LED package terminal, at least one pair of diodes connected in anti-parallel between the LED package terminals, so that an anode of a first diode is connected to a cathode of a second diode, wherein at least one of the diodes is a light emitting diode, wherein the first LED package terminal is detachably connectable to a first power supply terminal, and adapted to form a first capacitive coupling together with the first power supply terminal, wherein the second LED package terminal is detachably connectable to a second power supply terminal, and adapted to form a second capacitive coupling together with the second power supply terminal, such that, when the LED package terminals are connected to the power supply terminals, in a first period current will flow through the first diode, and in a second period current will flow through the second diode.

It should be understood that the phrase detachably connectable should be understood to mean that the LED package can be physically connected and disconnected without any permanent galvanic connections, requiring soldering or similar techniques. It should be noted that since the LED package terminals are detachably connectable to the power supply terminals, the entire LED package may be referred to as being detachably connectable.

According to the invention, each LED package terminal, when connected to a respective power supply terminal, constitutes a capacitive coupling, electrically comparable to a conventional capacitor. That is, the LED package terminals and the power supply terminals form the electrodes of the capacitive coupling, allowing electrical charge to be transferred between the electrodes.

The present invention is based on the realization that by providing a LED package which can be detachably capacitively connected to a power supply, there is no need for galvanic connections as provided by various soldering techniques. Hereby, the LED-package becomes less sensitive to temperature dependent degradation. By providing electrical connections which are less sensitive to temperature dependent degradation, the life time of the LED package may be increased.

The invention is not restricted to certain types of LEDs but any LED may be used in the LED package according to the invention, such as e.g. blue LEDs possibly combined with remote or proximity/vicinity phosphor conversion, white converted, or combinations of red, green, blue and A-type LEDs. Various colour LED packages may be provided on a string (e.g. per colour) or driven individually according to a driver protocol.

According to various embodiments of the present invention, the LED package may comprise a dielectric layer provided on the first LED package terminal and the second LED package terminal, respectively. Hereby, no dielectric layer is needed on the power supply terminals. Furthermore, the dielectric layer may be arranged onto the LED package terminals smoothly (i.e. a low variation in the dielectric layer thickness) and a dielectric material with a high dielectric constant may be chosen. It should be understood that by having a dielectric layer arranged onto the LED package terminals, the LED package terminals may be brought into physical contact with the power supply terminals, but still be galvanically isolated from the power supply terminals.

Preferably, both diodes are light emitting diodes. In this way, the LED package may be driven in a more efficient manner since both cycles of the applied alternating current is utilized to generate light. That is, when connected to a power supply, one LED will emit light during the first period, and the other LED will emit light during the second period.

In embodiments of the present invention the first LED package terminal comprises a first capacitive coupling surface, and the second LED package terminal comprises a second capacitive coupling surface, wherein the first and the second capacitive coupling surfaces are arranged in the same plane. In other words, the first and the second capacitive coupling surfaces will face the same geometrical direction, facilitating connection to power supply terminals arranged in one plane.

In other embodiments of the present invention, the first LED and the second LED may be sandwiched between the first LED package terminal and the second LED package terminal. Hereby, the LED package may be connected to power supply terminals which do not have their capacitive coupling surfaces arranged in the same plane. Preferably, in this configuration, the LEDs emit light in directions not covered by the LED package terminals. Also, more than two LEDs may be sandwiched between the first and the second LED package terminals.

Advantageously, the LED package is small enough to fit into a variety of modules, or even be dispersed into a liquid, e.g. paint. In the case of where the LED package is dispersed into a liquid, the liquid may be applied directly onto the power supply terminals. As an example, the LED package may have a volume in the order of 1 mm$^3$.

Furthermore, at least one of the LED package terminals according to a various embodiments of the invention may be transparent. Thus, the at least one transparent LED package terminal will not hinder the light emitted from at least one of the LEDs in the LED package. Therefore, side-emitting LEDs as well as top-emitting LEDs may be used in the LED package.

Furthermore, at least one of the LED package terminals according to various embodiments of the invention may be reflective. Hereby, the at least one reflective LED electrode may reflect and direct the light in a desired direction, possibly different from the direction of the light emitted by at least one of the LEDs. For example, if a top-emitting LED is provided as e.g. the first LED, and the top-emitting LED has a light output facing the reflective electrode, the reflective LED electrode may reflect the light in another direction. e.g. on the sides of the LED package (corresponding to the sides of the top-emitting LED).

According to a second aspect of the present invention, there is provided a lighting circuitry comprising an AC power supply having two power supply terminals, and a LED package according to the first aspect of the invention connected to the power supply. As the LED package is detachably connected to the power supply, the LED package can easily be repositioned in relation to the power supply.

According to at least one embodiment, more than one LED package may be capacitively coupled to the power supply. This is possible since the LED packages are separate units, capacitively connectable to the power supply terminals of the power supply. Furthermore, since no solders or other permanently galvanic connections are being used for the electrical connection between the LED package terminals and the power supply terminals, the number of LED packages capacitively coupled to the power supply may easily be varied. Hence, a varying number of LEDs may be driven without changing the layout of the lighting circuitry. Driving a varying number of LED packages may however require changing the resonance frequency of the lighting circuitry.

Furthermore, by avoiding soldering techniques for the connection between the LED package and the power supply, the weight of the LED package and/or the power supply may be reduced since no solders are needed. Also, by using capacitive couplings instead of galvanic connections between the LED package and the power supply, heat transferred from the LED package to the power supply may be reduced and hence, sensitive components in physical contact with the power supply may be prevented from temperature dependent degradation.

It should be understood that the LED package may be in electrical contact with the power supply via an external circuitry, such as a power supply circuitry e.g. a printed board circuitry. Furthermore, the power supply may be any type of power supply supplying alternating power, such as main supply, e.g. from a wall outlet, or a direct current driven AC power supply.

According to various embodiments of the present invention the lighting circuitry may comprise a dielectric layer arranged onto the first power supply terminal and the second power supply terminal, respectively. Hereby, no dielectric layer is needed on the LED package terminals. By having a dielectric layer arranged onto the power supply terminals, the power supply terminals may be brought into physical contact with the LED package terminals, but still be galvanically isolated from the LED package terminals.

The lighting circuitry may further comprise an inductor connected between the power supply and the first power supply terminal. Hereby, when the number of LED packages capacitively coupled to the power supply terminals is varied, such an inductor may be used to alter the resonance frequency of the lighting circuitry, so as to tune the circuitry.

The power supply terminals may be parallel tracks on a substrate and the first and the second LED package terminals may be arranged to at least partly overlap the first and the second power supply terminals respectively. Owing to this, a number of LED packages may be capacitively coupled to the power supply terminals. Furthermore, by having the power supply terminals arranged as parallel tracks, the power supply terminals may be shared by several LED packages, connected in parallel.

Furthermore, the LED package may be clamped against the first and the second power supply terminals by a clamping sheet attached to the substrate on which power supply terminals are provided. Hereby, an efficient way of providing for proximity of the LED package terminals and the power supply terminals is achieved. The clamping sheet may be any type of sheet providing for LED package terminals to come into close proximity of the power supply terminals, such that an electrical connection is possible.

According to a third aspect of the present invention, there is provided a method of manufacturing a LED package intended to be capacitively coupled to an AC power supply, the method comprising the steps of: providing a first electrode layer; patterning the first electrode layer; arranging a first LED and a second LED on top of the first electrode layer in such a way that an anode of the first LED and an anode of the second LED are facing the same first electrode layer; arranging a dielectric packaging material at least partly surrounding the first and the second LED; patterning the dielectric packaging material; arranging a second electrode layer on top of the dielectric packaging material; patterning the second electrode layer; wherein the patterning of the first electrode layer, the dielectric packaging material and the second electrode layer are performed in such a way that the first LED and the second LED are electrically connected in an anti-parallel configuration, i.e. an anode of the first LED is connected to a cathode of the second LED.

By using capacitive coupling between the LED packages and the power supply terminals, no process step using soldering for the connection between the LED package terminals and the power supply terminals is necessary. Furthermore, the LED package and the circuitry providing for the power supply may be manufactured separately.

At least one of the first electrode, the packaging material and the second electrode may be transparent. Hereby, the light output is less dependent on the positioning of the packaging material and/or the electrodes, since light is allowed to flow through the transparent packaging material and/or electrodes.

Moreover, the method according to various embodiments of the present invention may further comprise the step of arranging an at least partly dielectric layer on the first electrode. By arranging a dielectric layer on the first electrode, the first and the second LEDs are allowed to be at least partly electrically separated, and hence a LED-configured in an anti-parallel connection, as described in relation to the first aspect of the invention, is possible.

BRIEF DESCRIPTION OF THE DRAWINGS

These and other aspects of the present invention will now be described in more detail, with reference to the appended drawings showing embodiments of the invention, wherein.

DETAILED DESCRIPTION OF THE DRAWINGS

In the following description, the present invention is described with reference to a light-emitting device, more particularly to a LED package and a lighting circuitry. Furthermore, the invention is described with reference to a method for the manufacturing of such a LED package.

Figure 1:
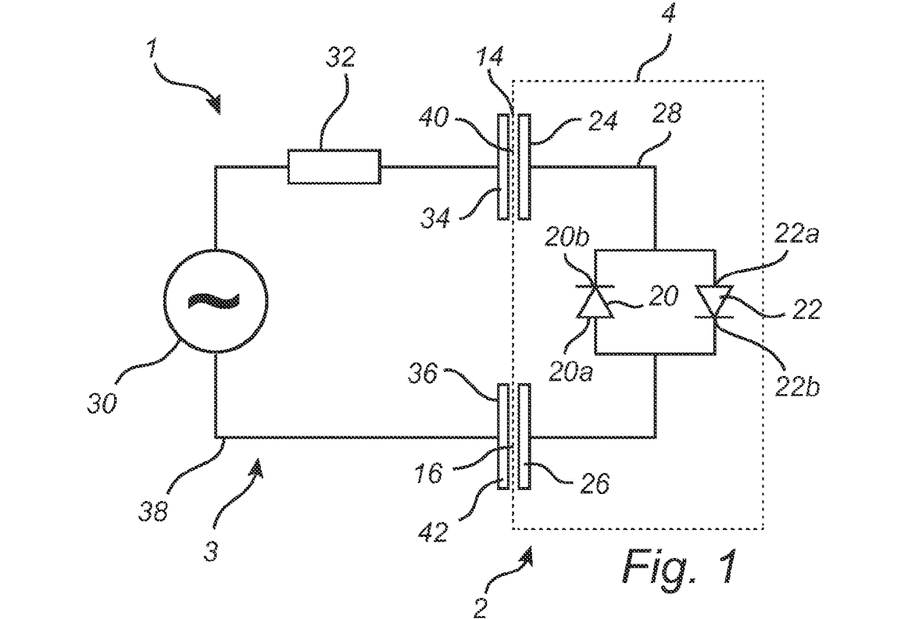
FIG. 1 schematically shows an exemplary circuitry of a light-emitting device according to various embodiments of the present invention.

FIG. 1 illustrates a lighting circuitry 1 for embodiments of a LED package 2 connected to a power supply 30. The LED package 2, defined by a dotted rectangle 4 in FIG. 1, comprises a first and a second LED 20, 22, a first LED package terminal 24, a second LED package terminal 26, and a LED package circuitry 28 connecting the two LEDs 20, 22 with the first and the second LED package terminals 24, 26. Furthermore, the lighting circuitry 1 in FIG. 1 comprises an AC power supply 30, an inductor 32, a first power supply terminal 34, a second power supply terminal 36, and a power supply circuitry 38 connecting the power supply 30, the inductor 32 and the two power supply terminals 34, 36. Dielectric layers (see FIG. 2) may be provided between the first LED package terminal 24 and the first power supply terminal 34, and between the second LED package terminal 26 and the second power supply terminal 36, respectively. Moreover, the first and the second LED package terminals 24, 26 and the first and the second power supply terminals 34, 36 may be made of any conducting material, such as a metal, e.g. gold, aluminium, copper etc.

Furthermore, each of the two LEDs 20, 22 comprises an anode 20a, 22a and a cathode 20b, 22b. Current flows through each of the LEDs 20, 22 from respective anode 20a, 22a to respective cathode 20b, 22b, this may be phrased as the direction of the respective LED 20, 22. The LEDs are connected in anti-parallel configuration, i.e. the cathode of one LED is connected to the anode of the other LED, and vice versa.

The anti-parallel configuration of two diodes (here two LEDs) makes the LED package suitable for connection to an AC power supply. During a first period (corresponding to a first half period of the sine function of the AC current), current flows through the first LED 20, and in a second period (corresponding to a first half period of the sine function of the AC current) current flows through the second LED 22.

It is noted that in principle, one of the LEDs may be replaced by a general diode, as long as the anti-parallel configuration is maintained.

Moreover, more than two LEDs may be connected in anti-parallel. Hereby, the LED package 2 may emit more light and furthermore, provide for a higher reliability in case one LED ceases to function. Furthermore, by having the two LEDs 20, 22 connected in an anti-parallel configuration, as shown in FIG. 1, the power may be efficiently used since both cycles of the applied alternating current may be used.

As indicated by the dotted rectangle 4 in FIG. 1, the first LED package terminal 24 is physically separated from the first power supply terminals 34, and correspondingly, the second LED package terminal 26 is physically separated from the second power supply terminal 36. The dielectric layers (shown in FIG. 2) may either be arranged onto the LED package terminals 24, 26 or onto the power supply terminals 34, 36. In other words, the LED package 2 is physically separated from the power supply 30. However, when the first LED package terminal 24 is arranged in close proximity to the first power supply terminal 34, the first LED package terminal 24 is electrically connected, i.e. capacitively coupled, to the first power supply terminal 34. Thus, current is allowed to flow from the power supply 30 to the LED package 2, and from the LED package 2 to the power supply 30, via the LED package circuitry 28 and power supply circuitry 38, i.e. the power supply circuitry 38 and the LED package 2 may be electrically connected by a capacitive coupling 14. Thus, the first LED package terminal 24, one of the dielectric layers, and the first power supply terminal 34 may be referred to as a first capacitor 40 of the lighting circuitry 1. Similarly, when the second LED package terminal 26 is arranged in close proximity to the second power supply terminal 36, the second LED package terminal 26 is electrically connected, i.e. capacitively coupled, to the second power supply terminal 36. Thus, current is allowed to flow from the power supply 30 to the LED package 2, and from the LED package 2 to the power supply 30, via the LED package circuitry 28 and power supply circuitry 38, i.e. the power supply circuitry 38 and the LED package 2 may be electrically connected by a capacitive coupling 16. Thus, the second LED package terminal 26, one of the dielectric layers and the second power supply terminal 36 may be referred to as a second capacitor 42 of the lighting circuitry 1.

It should be understood that each of the two capacitors 40, 42 functions as a conventional capacitor when the respective LED package terminal 24, 26 is electrically connected to the respective power supply terminal 34, 36, but the structural features are different from a conventional capacitor since the LED package terminals 24, 26 and the power supply terminals 34, 36 in respective capacitor 40, 42 are physically separable as previously described. In other words, the first LED package terminal 24 is detachably connectable to the first power supply terminal 34, and the second LED package terminal 26 is detachably connectable to the second power supply terminal 36, such that the LED package 2 is detachably connectable to the power supply 30, and the capacitors 40, 42 cease to exist and are not present anymore in case the LED package 2 is detached from the power supply.

Figure 2:
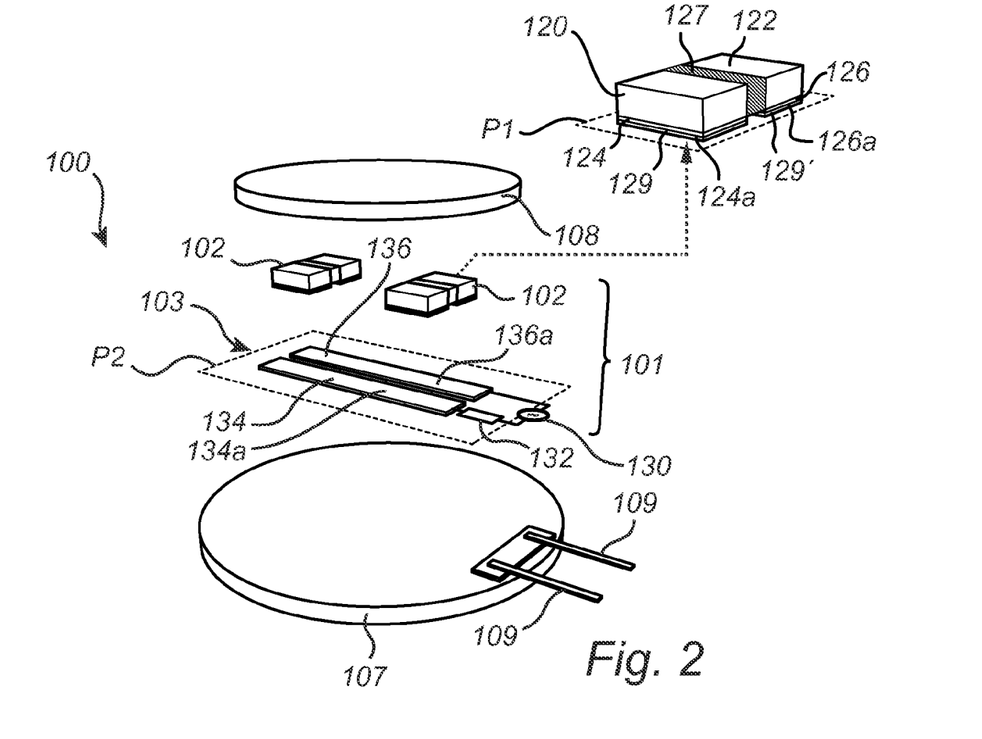
FIG. 2 is an exploded view of a light-emitting device according to an exemplary embodiment of the present invention.

FIG. 2 is an exploded view illustrating a solid state lighting (SSL) module 100 according to at least one example embodiment of the invention. The SSL module 100 comprises a lighting circuitry 101, a substrate 107, such as e.g. a printed board substrate, and a clamping sheet 108. Furthermore, in FIG. 2, external electrodes 109 are connected to the SSL module 100.

The lighting circuitry 101 in FIG. 2 is configured similar to the lighting circuitry 1 in FIG. 1 but comprises 2 LED packages 102 and a power supply circuitry 103. Each of the LED packages 102 comprises two LEDs 120, 122, separated by a separation layer 127, a first and a second LED package terminal 124, 126, each having a capacitive coupling surface 124a, 126a, respectively. A first and a second dielectric layer 129, 129' is arranged on the LED package terminals 124, 126. The power supply circuitry 103 comprises a power supply 130, an inductor 132 and two power supply terminals 134, 136, each having a capacitive coupling surface 134a, 136a, respectively. The power supply terminals 134, 136 in FIG. 2 are formed as parallel tracks 134, 136. Hence, the term power supply terminals 134, 136 and the term parallel tracks 134, 136 are used interchangeably throughout the application. The dielectric layers 129, 129' may be made of various materials such as e.g. Ta$_2$O$_5$ with a dielectric constant of 28.

As illustrated in FIG. 2, the capacitive coupling surfaces 124a, 126a of respective LED package terminals 124, 126 are arranged in the same geometrical plane P1. Furthermore, the capacitive coupling surfaces 134a, 136a of respective power supply terminal 134, 136 are also arranged in a common second plane P2, the second plane P2 being different from the first plane P1. When the LED package terminals 124, 126 are capacitive coupled to the power supply terminals 134, 136, the capacitive coupling surfaces 124a, 126a face the capacitive coupling surfaces 134a, 136a. This configuration may be referred to as a lateral configuration.

As mentioned previously, the LED packages 102 are capacitively coupled to the power supply circuitry 103 by the LED package terminals 124, 126 which are capacitively coupled to the power supply terminals 134, 136, (i.e. capacitively coupled as described with reference to FIG. 1 above). Hence the LED packages 102 are detachably connectable to the power supply circuitry 103 and may therefore be removed from and/or attached to the SSL module 100 accordingly. Furthermore, the first and the second dielectric layers 129, 129' separating the LED package terminals 124, 126 and the power supply terminals 134, 136 may be arranged either onto the LED package terminals 124, 126 or onto the power supply terminals 134, 136.

Since the LED packages 102 are detachably connectable to the power supply circuitry 103 the positioning of a specific LED package 102 relative the power supply circuitry 103 may be varied, as long as the LED package terminals 124, 126 of the specific LED package 102 are electrically connected, i.e. capacitively coupled, to the power supply terminals 134, 136. As illustrated in FIG. 2, the LED package terminals 124, 126 are arranged to overlap the parallel tracks 134, 136. Hence, the width and spacing of the parallel tracks 134, 136 are designed such that they overlap with the LED package terminals 124, 126. This configuration with overlapping electrodes, 124, 126, 134, 136 is possible since the capacitive coupling surfaces 124a, 126a of the LED package terminals 124, 126 are arranged in plane P1 and the capacitive coupling surfaces 134a, 136a of the power supply terminals 134, 136 are arranged in a second plane P2, as previously described. It should be noted that there is no need for an absolute overlap match, only a minimal overlap to allow sufficient capacitively coupling. Hereby, the geometry of the parallel tracks 134, 136 may allow for LED packages 102 having various geometries to be capacitively coupled to the parallel tracks 134, 136.

Furthermore, by having the SSL module 100 configured as illustrated in FIG. 2, where the LED packages 102 may be attached to the parallel tracks 134, 136 in various positions, it is also possible to have a varying number of LED packages 102 capacitively coupled to the parallel tracks 134, 136, without changing the design/geometry of the power supply circuitry 103. Additionally to varying the number of LED packages 102, different types of LED packages 102 may be attached to the power supply circuitry 103. For example, two LED packages 102 with e.g. different Lumen output and/or with different performance in time, may be capacitively coupled to the same power supply circuitry 103. Changing the number of LED packages 102 may change the overall capacity of the SSL module 100 and may thus require tuning of the power supply circuitry 103 (by e.g. changing the resonance frequency).

It should be noted that other electronics/electrical components may be arranged on the SSL module 100, such as resistors, capacitors, diodes and/or coils. Moreover, other electrical components may be arranged on a second substrate/PCB and connected to the SSL module 100. Another possibility is to place the power supply 130 and the inductor 132 of the power supply circuitry on a second substrate/PCB. Hereby the SSL module 100 may be made smaller since only the parallel tracks 134, 136 of the power supply circuitry 103 is arranged on the SSL module 100.

In the example illustrated in FIG. 2, the clamping sheet 108 may be used to arrange the LED packages 102 in close proximity to the power supply circuitry 38, and thus the LED package terminals 124, 126 in close proximity to the power supply terminals 134, 136 in order for the LED packages 102 to be electrically connected, i.e. capacitively coupled, to the power supply circuitry 103. The clamping sheet 108 may in one end be arranged on the substrate 107, and at another end arranged on top of the LED packages 102, such that the lighting circuitry 101 is arranged between the clamping sheet 108 and the substrate 107. Hereby, the LED package terminals 124, 126 may be clamped into close proximity to the power supply terminals 134, 136, in order for the LED package terminals 124, 126 to be electrically connected, i.e. capacitively coupled, to the power supply terminals 134, 136.

It should be noted that the LED package terminals 124, 126 and the power supply terminals 134, 136 may be made of any conducting material, such as a metal, e.g. gold, aluminium, copper etc.

Figure 3:
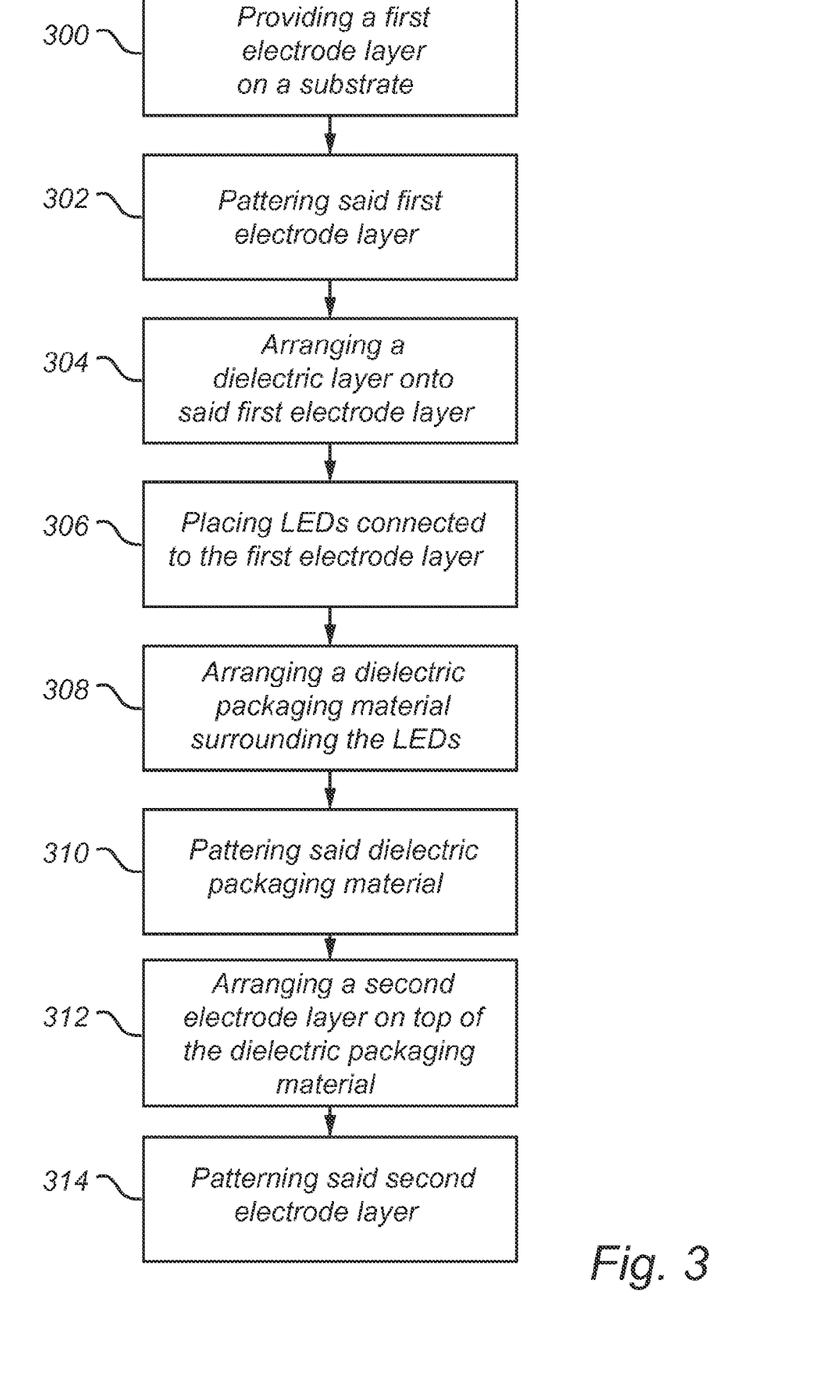
FIG. 3 is a flow chart illustrating a manufacturing method according to an embodiment of the present invention.

An embodiment of the present invention will now be elucidated with reference to the flow chart in FIG. 3 and the complement side views in FIGS. 4a-e, which schematically illustrate an exemplary procedure for the manufacturing of a LED package 202.

Figure 4A:
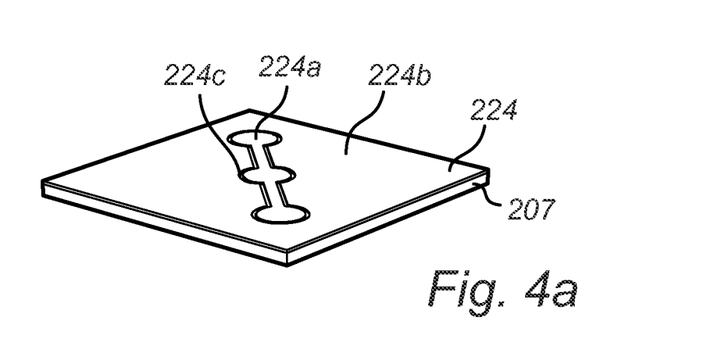
FIGS. 4a-4e schematically illustrates the result of the corresponding steps of the method of FIG. 3.

In a first step 300, a first electrode layer 224 is provided on a substrate 207, as also shown in FIG. 4a. As previously described, the first electrode layer 224 may be made of any conducting material, such as a metal, e.g. gold, aluminium, copper etc.

In a subsequent step 302, the first electrode layer 224 is patterned such that the electrode layer 224 is divided into a first electrode layer 224a and a second electrode layer 224b, which electrode layers 224a, 224b are electrically isolated from each other, as also shown in FIG. 4a. The patterning of the electrode layer 224 may be carried out by arranging a dielectric track 224c between the first and the second electrically isolated electrode layers 224a, 224b.

Figure 4B:
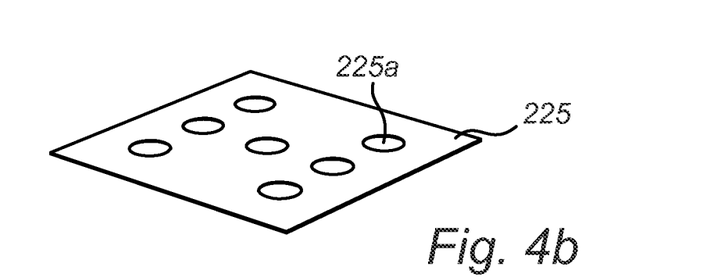

In a subsequent step 304, a dielectric layer 225 is arranged onto the first electrode layer 224. The dielectric layer 225 has openings 225a where appropriate, as shown in FIG. 4b. The dielectric layer 225 may e.g. be a polymer.

Figure 4C:
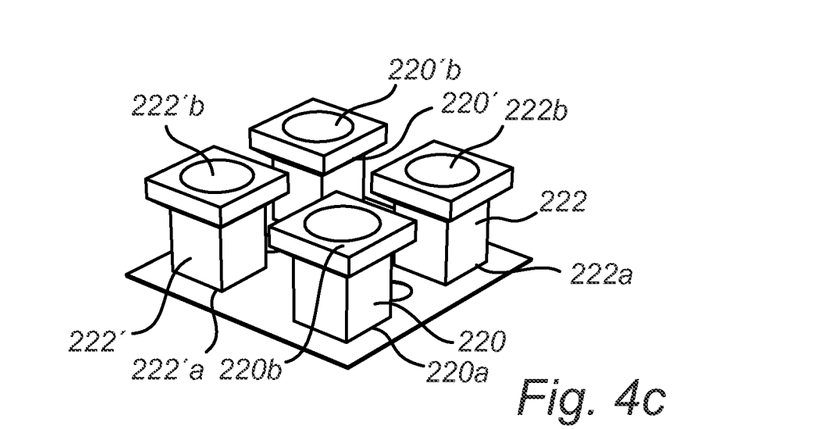

In a subsequent step 306, LEDs 220, 220', 222, 222' are placed such that they are electrically connected to the electrode layer 224. As shown in FIG. 4c, a first LED 220, a second LED 220', a third LED 222 and a fourth LED 222', each having an anode 220a, 220'a, 222a, 222'a and a cathode 220b, 220'b, 222b, 222'b respectively, are arranged onto the dielectric layer 225. The first and the second LED 220, 220' are electrically connected to the first electrically isolated electrode layer 224a, hence each of the first and the second LED 220, 220' is arranged on one of the openings 225a of the dielectric layer 225. The third and the fourth LED 222, 220' are electrically connected to the second electrically isolated electrode layer 224b, hence each of the third and fourth LED 222, 222' is arranged over one of the openings 225a of the dielectric layer 225. As illustrated in FIG. 4c the first, the second, the third and the fourth LED 220, 220', 222, 222' face the same geometrical direction, i.e. respective anode 220a, 220'a, 222a, 222'a of the four LEDs 220, 220', 222, 222' are facing the first electrode layer 224. The four LEDs 220, 220', 222, 222' may be connected to the first electrode layer 224 by pin transferred, screen printed ICA or screen printed solder.

Figure 4D:
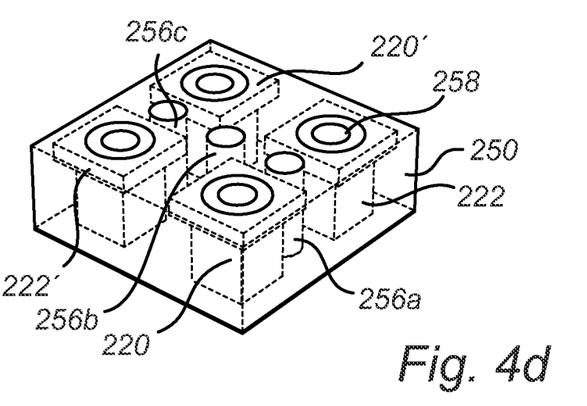

In a subsequent step 308, a dielectric packaging material 250 is arranged to at least partly surround the four LEDs 220, 220', 222, 222', as shown in FIG. 4d. The package material 250 may be transparent such that light emitted from at least one of the four LEDs 220, 220', 222, 222' may be passed through the package material 250. It should be noted that the dielectric packaging material 250 may be created in all kinds of forms by e.g. 3D lithography. For example, different forms of the dielectric packaging material 250 may cause different light distribution or a more efficient light-output.

In a subsequent step 310, the package material 250 is patterned in such a way that paths inside the package material 250 are electrically conductive. As illustrated in FIG. 4d, a first, a second and a third conductive path 256a, 256b, 256c are patterned in a plane between the four LEDs 220, 220' 222, 222', such that the first conductive path 256a is arranged between the first LED 220 and the third LED 222, the third conductive path 256c is arranged between the second LED 220' and the fourth LED 222', and the second conductive path 256b is arranged between the first and second conductive paths 256a, 256c. Each conductive path 256a, 256b, 256c is connected to the first electrode layer 224 through openings 225a on the dielectric layer 225. That is, an electrical connection may be established, by e.g. conventional contacts or solders, by the openings 225a. Thus, the contacts may be placed on the openings 225a where the LEDs 220, 220', 222, 222' are placed, but also on the openings 225a where the package material are patterned to assure a connection between the first electrode layer 224 and the second electrode layer 226. Furthermore, the patterning of the packaging material 250 provides for openings 258 and/or contacts 258 on the top of respective LED 220, 220', 222, 222'. The package material may be a polymer, such as e.g. SU8.

In a subsequent step 312, a second electrode layer 226 is arranged on top of the packaging material 250. The configuration shown in FIG. 4e may be referred to as a vertical LED package 202 since the LEDs 220, 220', 222, 222' are sandwiched between the first and the second electrode layer 224, 226. As previously described the second electrode layer 226 may be made of any conducting material, such as a metal, e.g. gold, aluminium, copper etc.

Figure 4E:
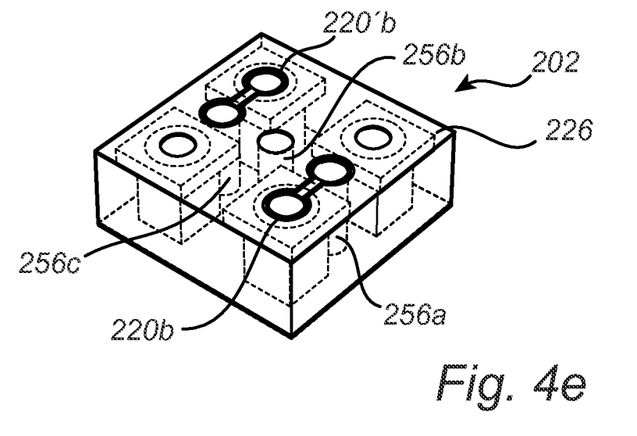

In a subsequent step 314, the second electrode layer 226 is patterned such that the electrode layer 226 provides for an electrically connection between respective cathode 220b, 220'b of the first and the second LED 220, 220' (which LEDs 220, 220' are connected to the first electrically isolated electrode layer 224a) and the second electrically isolated electrode layer 224b by electrically connection to the first and third conductive paths 256a, 256c, respectively, as shown in FIG. 4e. Furthermore, the isolated electrode layer 224a is electrically connected to the second electrode layer 226 by the second conductive path 256b. The second electrode layer 226 is preferably transparent such that light emitted from at least one of the four LEDs 220, 220', 222, 222' may flow through.

It should be noted that according to the process described in FIG. 3, the patterning of the first electrode layer 224, the packaging material 250 and the second electrode layer 226 are performed in such a way that the four LEDs 220, 220', 222, 222' are electrically connected in an anti-parallel configuration. That is, anode 220a, 220'a of the first and the second LED 220, 220' is connected to the cathode 222b, 222'b of the third and fourth LED 222, 222', respectively, as illustrated for the LED package 202 in FIG. 4e.

Furthermore, the LED package 202 manufactured by the process described with reference to FIG. 3 and FIG. 4a-e may be electrically connected to a power supply (as shown in FIG. 1) by that the first and second electrode layers 224, 226 are capacitively coupled to a first and a second power supply terminal connected to the power supply (e.g. via a power supply circuitry) respectively, similar to the capacitive coupling described with reference to FIG. 1. In other words, the first electrode layer 224 and the second electrode layer 226 may each function as one half of a respective capacitor, when electrically connected to the first and the second power supply terminals of the power supply. For the capacitive coupling to be functional an additional dielectric layer should be arranged between the electrode layers 224, 226 and the power supply terminals. The additional dielectric layer may be arranged on top of the electrode layers 224, 226 or one the power supply terminals. If the additional dielectric layer is arranged on top of the electrode layers 224, 226 the additional dielectric layer may be made with little varying dielectric thickness and with the use of a material with a very high dielectric constant, such as e.g. $Ta_2O_5$ (with a dielectric constant around 28). Furthermore, it should be noted that the first and the second electrode layer 224, 226 and the packaging material 250 may be patterned by lithography steps and thus, electrical connections between the LEDs 220, 220', 222, 222' and other components, such as e.g. resistors, transistors, diodes, coils etc., may be established.

It should be noted that the dielectric layer 225 is to isolate the first and the second LED 220, 220' from the third and the fourth LED 222, 222', preventing shorts from occurring. The dielectric layer is not needed when the LEDs 220, 220', 222, 222' are arranged in a conventional parallel configuration, i.e. not the anti-parallel configuration as shown in FIG. 4e.

In another embodiment of the invention, the patterning of the first electrode layer 224 is performed such that the first electrically isolated electrode layer 224a provides for a first capacitive coupling to a power supply terminal, and the second electrically isolated electrode layer 224b provides for a second capacitive coupling to another power supply terminal. That is, the second electrically isolated electrode layer 224b replace the second electrode layer 226 such that no second electrode layer 226 is needed. This configuration may be referred to as a lateral LED package where the two electrically isolated electrode layers 224a, 224b are configured in the same plane. Hence this lateral configuration will be similar to the configuration described with reference to FIG. 2. An advantage of the lateral configuration is that the electrode layers 224a, 224b do not have to be transparent since light may be emitted opposite to the electrode layers 224a, 224b.

In an optional preceding step to step 300, a release layer may be placed upon the substrate 207. The release layer may then be etched away in a step subsequent to step 314, such that the LED package 202 is released from the release layer. The release layer may be made of a thick oxide layer which can be etched away by means of e.g. a BOE etch, preferably the BOE etch do not deteriorate any material from the LED package 202.

It should be noted that any of one the electrodes/electrode layers 14, 16, 124, 126, 224, 226 may be transparent. Furthermore, at least one of the electrodes/electrode layers may be reflective. Moreover, any one of the LEDs 20, 22, 120, 122, 220, 220', 222, 222' may be a top-emitting LED emitting light in same direction of the anode 20a, 22a, 220a, 220'a, 222a, 222'a or the cathode 20b, 22b, 220b, 220'b, 222b, 222'b, or a side-emitting LED emitting light perpendicular to the anode 20a, 22a, 220a, 220'a, 222a, 222'a or the cathode 20b, 22b, 220b, 220'b, 222b, 222'b. For example, a top-emitting LED may be used with a reflective electrodes/electrode layer 14, 16, 124, 126, 224, 226, this enables the possibility to use top-emitting LEDs and still pass the emitted light from the top-emitting LED in another direction. A reflective electrodes/electrode layer 14, 16, 124, 126, 224, 226 may also enhance the light efficiency of a side-emitting LED.

The person skilled in the art realizes that the present invention by no means is limited to the embodiments described above. For example, other alternatives of the above described LED packages using capacitive coupling as electrically connection to a power supply, are within the scope of the invention.

The invention claimed is:

1. A light emitting diode, LED package arranged to emit light when connected to an AC power supply, comprising:
    a first LED package terminal and a second LED package terminal,
    at least one pair of light emitting diodes connected in anti-parallel between said LED package terminals, so that an anode of a first light emitting diode is connected to a cathode of a second light emitting diode,
    wherein the first LED package terminal is detachably connectable to a first power supply terminal, and adapted to form a first capacitive coupling together with said first power supply terminal,
    wherein the second LED package terminal is detachably connectable to a second power supply terminal, and adapted to form a second capacitive coupling together with said second power supply terminal,
    such that, when the LED package terminals are connected to the power supply terminals, the at least one pair of light emitting diodes are directly connected to the AC power supply, and in a first period current will flow through the first light emitting diode, and in a second period current will flow through the second light emitting diode.

2. The LED package according to claim 1, comprising a dielectric layer provided on the first LED package terminal and the second LED package terminal, respectively.

3. The LED package according to claim 1, where the first LED package terminal comprises a first capacitive coupling surface, and the second LED package terminal comprises a second capacitive coupling surface, wherein the first and second capacitive coupling surfaces are arranged in a common plane.

4. The LED package according to claim 1, where the first light emitting diode and the second light emitting diode are sandwiched between the first LED package terminal and the second LED package terminal.

5. The LED package according to claim 1 where at least one of the LED package terminals is transparent.

6. The LED package according to claim 1 where at least one of the LED package terminals is reflective.

7. A lighting circuit comprising:
    an LED package according to claim 1, wherein the first LED package terminal is capacitively connected to the first power supply terminal and the second LED package terminal is capacitively connected to the second power supply terminal; and
    an alternating current power supply connected to the first and second power supply terminals.

8. The lighting circuitry according to claim 7, further comprising a dielectric layer provided on the first power supply terminal and the second power supply terminal, respectively.

9. The lighting circuitry according to claim 8, further comprising an inductor connected between said power supply and said first power supply terminal.

10. The lighting circuitry according to claim 7, wherein the first and the second power supply terminals are arranged as parallel conducting tracks, and wherein the first and the second LED package terminals are arranged to at least partly overlap the first and the second power supply terminals, respectively.

11. The lighting circuitry according to claim 7, wherein said first and second power supply terminals are provided on a substrate, and wherein said LED package is clamped against the first and the second power supply terminals by a clamping sheet attached to said substrate.

12. The LED package according to claim 1, wherein the first LED package terminal and the first power supply terminal are capacitive terminals of said first capacitive coupling, and wherein the second LED package terminal and the second power supply terminal are capacitive terminals of said second capacitive coupling.

13. The LED package according to claim 1, wherein:
    the at least one pair of light emitting diodes are arranged on top of a first electrode layer;
    a dielectric packaging material at least partly surrounds the at least one pair of light emitting diodes;
    a second electrode layer is arranged on top of the dielectric packaging material; and
    the at least one pair of light emitting diodes are electrically isolated from one another.

14. The LED package according to claim 13, wherein the dielectric packaging comprises electrically conductive paths.

15. A method of manufacturing a LED package for capacitively coupling to an AC power supply, said method comprising the steps of:
    providing a first electrode layer;
    patterning said first electrode layer;
    arranging a first LED and a second LED on top of the first electrode layer in such a way that an anode of the first LED and an anode of the second LED are facing the first electrode layer;
    arranging a dielectric packaging material at least partly surrounding the first and the second LED;
    patterning said dielectric packaging material;
    arranging a second electrode layer on top of the dielectric packaging material, wherein said first electrode layer is electrically isolated from the second electrode layer;
    patterning said second electrode layer;
    wherein said patterning of said first electrode layer, said dielectric packaging material and said second electrode layer are performed in such a way that the first LED and the second LED are electrically connected in an anti-parallel configuration in which the anode of the first LED is connected to a cathode of the second LED.

16. The method according to claim 15, wherein at least one of the first electrode, the packaging material and the second electrode is transparent.

17. The method according to claim 15, further comprising arranging an at least partly dielectric layer on the first electrode layer.

18. The method according to claim 17, wherein four light emitting diodes are electrically connected in an anti-parallel configuration.

19. The method according to claim 15, wherein the step of patterning said dielectric packaging material results in the creation of electronically conductive paths inside the packaging material.

* * * * *